US012660485B2

(12) United States Patent
Kim et al.

(10) Patent No.: US 12,660,485 B2
(45) Date of Patent: Jun. 16, 2026

(54) LIGHT EMITTING DISPLAY DEVICE, MANUFACTURING METHOD THEREOF, AND VEHICLE HAVING LIGHT EMITTING DISPLAY DEVICE

(71) Applicant: Samsung Display Co., LTD., Yongin-si (KR)

(72) Inventors: Si Kwang Kim, Yongin-si (KR); Woong Sik Kim, Yongin-si (KR); Donghwan Bae, Yongin-si (KR); Jin-Su Byun, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 377 days.

(21) Appl. No.: 18/303,755

(22) Filed: Apr. 20, 2023

(65) Prior Publication Data

US 2024/0023419 A1 Jan. 18, 2024

(30) Foreign Application Priority Data

Jul. 12, 2022 (KR) ........................ 10-2022-0085845

(51) Int. Cl.
*H10K 59/80* (2023.01)
*B60K 35/22* (2024.01)
(Continued)

(52) U.S. Cl.
CPC ......... *H10K 59/8792* (2023.02); *B60K 35/60* (2024.01); *H10K 59/122* (2023.02); *H10K 71/233* (2023.02); *B60K 35/22* (2024.01)

(58) Field of Classification Search
CPC ............. H10K 59/8792; H10K 59/122; H10K 71/233; H10K 59/126; H10K 50/865; H10K 50/844; H10K 71/00; H10K 59/875; B60K 35/60; B60K 35/22; B60K 35/00; B60K 35/425; H01L 25/075; H10H 20/01; H10H 20/855
See application file for complete search history.

(56) References Cited

U.S. PATENT DOCUMENTS

2010/0271721 A1 10/2010 Gaides et al.
2020/0168844 A1* 5/2020 Kim ....................... H10K 59/12
(Continued)

FOREIGN PATENT DOCUMENTS

CN 113281897 8/2021
CN 114497409 A 5/2022
(Continued)

OTHER PUBLICATIONS

Extended European Search Report for European Patent Application No. 23183658.6, dated Dec. 4, 2023.

*Primary Examiner* — Jonathan Han
(74) *Attorney, Agent, or Firm* — F. CHAU & ASSOCIATES, LLC

(57) ABSTRACT
According to embodiments, a light emitting display device includes a light emitting diode (LED) positioned on a substrate and including an emission layer, a pixel definition layer including an opening corresponding to the emission layer, and a plurality of light-shielding linear patterns positioned on the pixel definition layer and the emission layer and extending in a first direction. The plurality of light-shielding linear patterns include a recess portion of a concave shape.

23 Claims, 24 Drawing Sheets

(51) Int. Cl.
 *B60K 35/60* (2024.01)
 *H10K 59/122* (2023.01)
 *H10K 71/20* (2023.01)

(56) References Cited

U.S. PATENT DOCUMENTS

| | | | |
|---|---|---|---|
| 2021/0036263 | A1 | 2/2021 | Kim et al. |
| 2021/0183961 | A1* | 6/2021 | Kim .................... H10K 59/873 |
| 2021/0217831 | A1* | 7/2021 | Jung ................. H10K 59/8792 |
| 2022/0149108 | A1 | 5/2022 | Yoo et al. |
| 2023/0172003 | A1 | 6/2023 | Yu et al. |

FOREIGN PATENT DOCUMENTS

| | | |
|---|---|---|
| KR | 10-2019-0099304 | 8/2019 |
| KR | 10-2020-0019535 | 2/2020 |
| KR | 10-2020-0063591 | 6/2020 |
| KR | 10-2021-0040073 | 4/2021 |
| KR | 10-2022-0012458 | 2/2022 |
| KR | 10-2022-0062208 A | 5/2022 |

* cited by examiner

TOL

403

(A)

(B)

(A)

(B)

(A)

(B)

(A)

BL (B)

DR3

DR2 — DR1

LIGHT EMITTING DISPLAY DEVICE, MANUFACTURING METHOD THEREOF, AND VEHICLE HAVING LIGHT EMITTING DISPLAY DEVICE

CROSS-REFERENCE TO RELATED APPLICATION(S)

This application claims priority to and benefits of Korean Patent Application No. 10-2022-0085845 under 35 U.S.C. § 119, filed in the Korean Intellectual Property Office on Jul. 12, 2022, the entire contents of which are incorporated herein by reference.

BACKGROUND

1. Technical Field

The disclosure relates to a light emitting display device including multiple light-shielding linear patterns on a front surface of an emission layer, and a manufacturing method thereof, and to a vehicle including such a light emitting display device.

2. Description of the Related Art

A display device is a device for displaying an image, and may include a liquid crystal display (LCD), an organic light emitting diode (OLED) display, and the like. The display device may be used in various electronic devices such as a mobile phone, a navigation device, a digital camera, an electronic book, a portable game machine, and various terminals.

A display device may be used in various fields other than for an electronic device. For example, digital display is being used in vehicles for displaying a conventional analog instrument panel (an instrument panel) and/or a center fascia.

The above information disclosed in this Background section is only for enhancement of understanding of the background of the described technology, and therefore it may contain information that does not form the prior art that is already known in this country to a person of ordinary skill in the art.

SUMMARY

Embodiments are for blocking light emitted from a display device from being emitted in a specific direction.

This is to ensure that the light emitted from the display device used in the vehicle is provided to the driver's eyes and does not interfere with driving.

This is also to prevent the display device used in the vehicle from blocking the driver's view as it is reflected on the vehicle's front glass at night.

A light emitting display device according to an embodiment may include a light emitting diode (LED) positioned on a substrate and including an emission layer, a pixel definition layer including an opening corresponding to the emission layer, and a plurality of light-shielding linear patterns positioned on the pixel definition layer and the emission layer and extending in a first direction. The plurality of light-shielding linear patterns may include a recess portion of a concave shape.

At least one of a plurality of light-shielding linear patterns may cross the emission layer and overlap the emission layer.

The recess portion may extend long in the first direction in the light-shielding linear pattern.

The plurality of light-shielding linear patterns may include a viewing angle so that light emitted from the emission layer is not emitted more than an angle with respect to a normal line, and the viewing angle may be about 30 degrees.

The plurality of light-shielding linear patterns may include a height of about 20 $\mu$m or more and about 50 $\mu$m or less, and a width is about 1 $\mu$m or more and about 3 $\mu$m or less.

An upper transparent organic layer positioned between adjacent ones of the plurality of light-shielding linear patterns may be further included, and the upper transparent organic layer may include a plurality of openings extending in the first direction, and the plurality of light-shielding linear patterns may be positioned in a plurality of openings.

The highest upper surface of at least one of the light-shielding linear patterns may be positioned higher than the highest upper surface of the upper transparent organic layer.

An upper transparent inorganic layer positioned above the upper transparent organic layer and in a part that does not overlap the plurality of light-shielding linear patterns may be further included.

A width of the part where the upper transparent inorganic layer and the upper transparent organic layer contact each other may be same, and the plurality of light-shielding linear patterns may not be positioned on the upper transparent organic layer.

The upper transparent inorganic layer may include a narrower width than the upper transparent organic layer, and the plurality of light-shielding linear patterns may be positioned on the upper transparent organic layer that is not covered by the upper transparent inorganic layer.

A manufacturing method of a light emitting display device according to an embodiment may include coating a transparent organic material on a substrate on which an encapsulation layer is formed, forming an upper transparent inorganic layer on the transparent organic material and a hard mask on the upper transparent inorganic layer, etching the transparent organic material by using the hard mask as a mask to complete an upper transparent organic layer including an opening, removing the hard mask, coating a light-shielding organic material including a black color pigment on the upper transparent organic layer and the upper transparent inorganic layer, and developing the light-shielding organic material to complete a light-shielding linear pattern.

In the removing of the hard mask, wet etching may be performed using an etchant that removes the hard mask.

In the completing of the upper transparent organic layer, the hard mask may be dry etched and a by-product may be positioned within the opening of the upper transparent organic layer, and the etchant that removes the hard mask may also remove the by-product together therewith.

The hard mask may be formed of aluminum or an aluminum alloy, and the by-product may include aluminum oxide.

The forming of the upper transparent inorganic layer and the hard mask may include stacking and etching an inorganic insulating material or a transparent conductive oxide on the transparent organic material by using a first mask to complete the upper transparent inorganic layer, and stacking a metal or an alloy on the upper transparent inorganic layer by using a second mask to complete the hard mask.

The first mask and the second mask may be a same mask, the inorganic insulating material may be a silicon oxide or a silicon nitride, and the metal may be aluminum or molybdenum.

The first mask and the second mask may be different masks, and a width of the hard mask may be larger than a width of the upper transparent inorganic layer.

The upper transparent inorganic layer and the hard mask may be formed by being dry-etched together by using one mask, the upper transparent inorganic layer may include an inorganic insulating material or a transparent conductive oxide, the inorganic insulating material may be a silicon oxide or a silicon nitride, the hard mask may include a metal or an alloy, and the metal may be aluminum or molybdenum.

The upper transparent inorganic layer and the hard mask may be formed by being wet-etched together by using one mask, the upper transparent inorganic layer may include a transparent conductive oxide, the hard mask may include aluminum or an aluminum alloy, and a width of the hard mask may be larger than a width of the upper transparent inorganic layer.

In the completing of the light-shielding linear pattern, a part adjacent to the upper transparent organic layer among the light-shielding organic material may be maintained during the developing and a part far from the upper transparent organic layer may be removed so that a recess portion may be formed on the completed light-shielding linear pattern.

A vehicle according to an embodiment may include a first light emitting display device. The first light emitting display device may include a light emitting diode (LED) positioned on a substrate and including an emission layer, a pixel definition layer including an opening corresponding to the emission layer, and a plurality of first light-shielding linear patterns positioned on the pixel definition layer and the emission layer and extending in a first direction. The plurality of first light-shielding linear patterns may include a recess portion of a concave shape on top.

The vehicle may further include a second light emitting display device, and the second light emitting display device may include a light emitting diode (LED) positioned on a substrate and including an emission layer, a pixel definition layer including an opening corresponding to the emission layer, and a plurality of second light-shielding linear patterns positioned on the pixel definition layer and the emission layer and extending in a second direction different from the first direction. The plurality of second-light-shielding linear patterns may include a recess portion of a concave shape on top.

An upper transparent organic layer positioned between a plurality of adjacent first light-shielding linear patterns may be further included, the upper transparent organic layer may include a plurality of openings extending in the first direction, and the plurality of first light-shielding linear patterns may be respectively positioned in the plurality of openings.

The highest upper surface of at least one of the first light-shielding linear patterns may be positioned higher than the highest upper surface of the upper transparent organic layer.

An upper transparent inorganic layer positioned at a portion on the upper transparent organic layer and that does not overlap the plurality of first light-shielding linear patterns may be further included.

According to embodiments, a plurality of light-shielding linear patterns may be formed on the entire surface of the emission layer in one direction so that light provided from the emission layer is not emitted in a certain direction.

The light emitted from the display device used in the vehicle may not be provided to the vehicle's front glass so the light may not be reflected from the vehicle's front glass at night and may not obstruct the driver's view.

The light emitted from the display device positioned on the passenger seat may not be provided to the driver so that driving may not be disturbed.

Compared with a comparative example, which forms a light-shielding linear pattern in a form of a film on the entire surface of the emission layer, an embodiment may be directly formed in the light emitting display device, so there may be no problem of misalignment, and a moiré phenomenon may be eliminated. Such a design may have merits including that the thickness is thin, the manufacturing cost is reduced, and the transmittance is high.

DETAILED DESCRIPTION OF THE EMBODIMENTS

Figure 1:
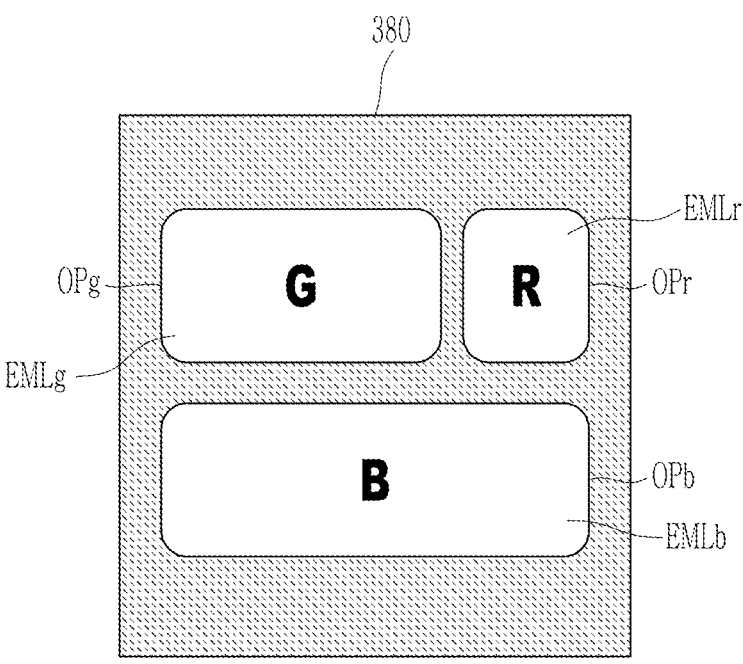
FIG. 1 is a top plan view schematically showing a pixel of a light emitting display device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

In order to clarify the disclosure, parts that are not connected with the description will be omitted, and the same elements or equivalents are referred to by the same reference numerals throughout the specification.

Further, since sizes and thicknesses of elements such as layers, films, panels, regions, etc. shown in the accompanying drawings may be arbitrarily given for better understanding and ease of description, the disclosure is not limited to the illustrated sizes and thicknesses.

It will be understood that when an element such as a layer, film, area, or substrate is referred to as being "on" another element, it can be directly on the other element or intervening elements may also be present. In contrast, when an element is referred to as being "directly on" another element, there may be no intervening elements present. Further, in the specification, the word "on" or "above" means positioned on or below the object portion, and does not necessarily mean positioned on the upper side of the object portion based on a gravitational direction.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Further, in the specification, the phrase "in a plan view" may mean viewing the object portion from the top, and the phrase "in cross-sectional view" may mean viewing a cross-section of which the object portion is vertically cut from the side.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Throughout the specification, when it is said that parts such as a wire, a layer, a film, a region, a plate, and a constituent element are "extended in a first direction or a second direction", this may not mean only a straight line shape extending straight in the corresponding direction, but also may include a structure that is bent in a part, has a zigzag structure, or extends while including a curved line structure as a structure that extends overall along the first direction or the second direction.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Electronic devices (e.g., a mobile phone, a TV, a monitor, a laptop computer, etc.) included in display devices and display panels described in the specification, or electronic devices included in display devices and display panels, etc. manufactured by manufacturing methods described in a specification, are not excluded from a scope of this specification.

Hereinafter, a light-shielding linear pattern formed in a light emitting display device according to an embodiment is described with reference to FIG. 1 to FIG. 4.

Figure 2:
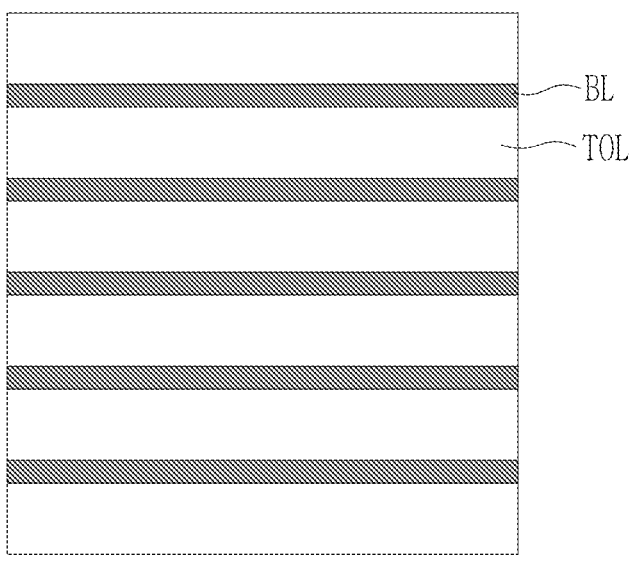
FIG. 2 is a top plan view schematically showing multiple light-shielding linear patterns and an upper transparent organic layer formed in a light emitting display device according to an embodiment.
Figure 3:
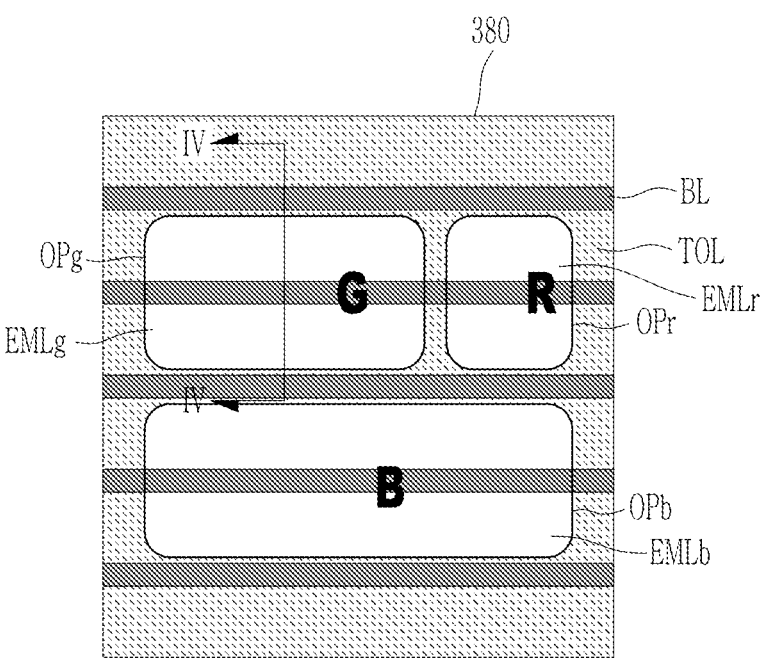
FIG. 3 is a top plan view schematically showing a light emitting display device according to both FIG. 1 and FIG. 2.
Figure 4:
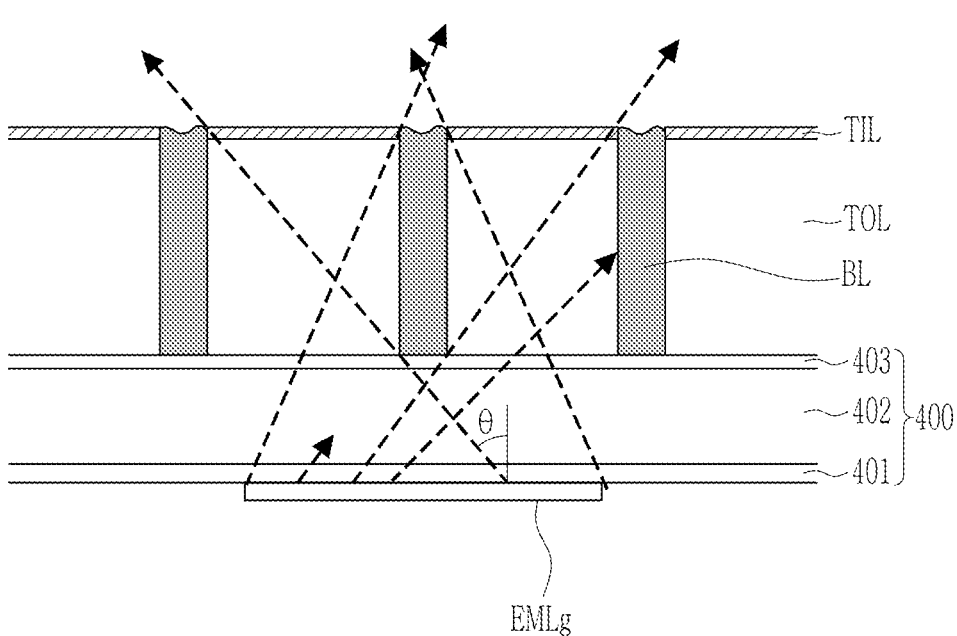
FIG. 4 is a schematic cross-sectional view taken along line IV-IV of FIG. 3.

FIG. 1 is a top plan view schematically showing a pixel of a light emitting display device according to an embodiment, FIG. 2 is a top plan view schematically showing multiple light-shielding linear patterns and an upper transparent organic layer formed in a light emitting display device according to an embodiment, FIG. 3 is a top plan view schematically showing a light emitting display device according to both FIG. 1 and FIG. 2, and FIG. 4 is a schematic cross-sectional view taken along line IV-IV of FIG. 3.

Three light emitting diodes (LED) representing different colors R, G, and B positioned adjacent to each other are shown, and each light emitting diode (LED) may include an emission layer EMLr, EMLg, or EMLb.

Each emission layer EMLr, EMLg, and EMLb may be a part that emits light from the light emitting diode (LED), and may be partitioned by a pixel definition layer 380. Each emission layer EMLr, EMLg, and EMLb may have a structure that overlaps the opening OPr, Opg, and Opb positioned in the pixel definition layer 380, and at least some of each emission layer EMLr, EMLg, and EMLb may have a structure exposed upward without overlapping the pixel definition layer 380. According to an embodiment, each emission layer EMLr, EMLg, and EMLb may be positioned only within each opening Opr, Opg, and Opb of the pixel definition layer 380. Although not shown in FIG. 1, a cathode and an encapsulation layer may be positioned on the pixel definition layer 380 and the emission layers EMLr, EMLg, and EMLb, and an anode may be positioned under each emission layer EMLr, EMLg, and EMLb. Here, an anode, an emission layer EMLr, EMLg, and EMLb, and the cathode may constitute one light emitting diode (LED). The detailed stacked structure of the light emitting diode (LED) is described with reference to FIG. 23 and FIG. 24.

FIG. 2 shows a planar structure of multiple light-shielding linear patterns BL and an upper transparent organic layer TOL positioned adjacent thereto, which may be disposed on the light emitting diode (LED).

The light-shielding linear pattern BL may extend in a direction and may be disposed so that the interval between the adjacent light-shielding linear patterns BL may be constant. In another embodiment, the interval between the light-shielding linear pattern BL may not be constant.

An upper transparent organic layer TOL may be positioned in the region where multiple light-shielding linear patterns BL may not be formed. It may have a structure in which each of multiple light-shielding linear patterns BL may be formed in the opening formed in the upper transparent organic layer TOL.

Although not shown in FIG. 2, referring to FIG. 4, an upper transparent inorganic layer TIL may be positioned on the upper transparent organic layer TOL according to an embodiment. The upper transparent inorganic layer TIL may be positioned in the region where the light-shielding linear pattern BL is not formed and may not overlap the light-shielding linear pattern BL. According to an embodiment, the upper transparent inorganic layer TIL may be omitted.

An embodiment of the structure where multiple light-shielding linear patterns BL and the upper transparent organic layer TOL like FIG. 2 are disposed on the light emitting diode (LED) having the arrangement like FIG. 1 is shown in FIG. 3.

In the embodiment of FIG. 3, a light-shielding linear pattern BL is disposed to cross a light emitting diode (LED) and a light-shielding linear pattern BL and may have the structure that is disposed on both sides of the light emitting diode (LED) and between the adjacent light emitting diodes (LED).

For example, each emission layer EMLr, EMLg, and EMLb and/or the openings OPr, Opg, and Opb of the pixel definition layer 380 may overlap a light-shielding linear pattern BL, and a light-shielding linear pattern BL may pass on the center of each emission layer EMLr, EMLg, and EMLb and/or the openings Opr, Opg, and Opb of the pixel definition layer 380. The structure may have a pair of light-shielding linear patterns BL that may not overlap, but may be disposed adjacent to each emission layer EMLr, EMLg, and EMLb and/or the openings Opr, Opg, and Opb of the pixel definition layer 380, and a pair of light-shielding linear patterns BL may overlap the pixel definition layer 380.

The cross-section line Iv-Iv of FIG. 3 is formed around the green emission layer EMLg, and the cross-section structure is described in detail with reference to FIG. 4 is based on the green emission layer EMLg.

FIG. 4 shows only the emission layer EMLg briefly, and the anode and the cathode that may be positioned above and below are omitted. To emit light through the light emitting diode (LED) is to emit light from the emission layer EMLg, and the light emitted from the emission layer EMLg may be emitted in various directions. However, due to the light-shielding linear pattern BL positioned on the emission layer EMLg, light is not transmitted at an angle greater than a certain angle. As a result, the viewing angle of the light emitting display device is limited.

The viewing angle of the light emitting display device may be determined according to the distance between the light-shielding linear pattern BL and the emission layer EMLg, the interval between the adjacent light-shielding linear patterns BL, and the width and the height of the light-shielding linear pattern BL, and hereinafter the characteristic of the light-shielding linear pattern BL according to an embodiment is described.

The light-shielding linear pattern BL may be formed of a material capable of blocking light, and may be formed of the same material as a light blocking member (a black matrix) used in a light emitting display device. The light-shielding linear pattern BL may be formed of an organic material including a black color pigment.

Figure 15:
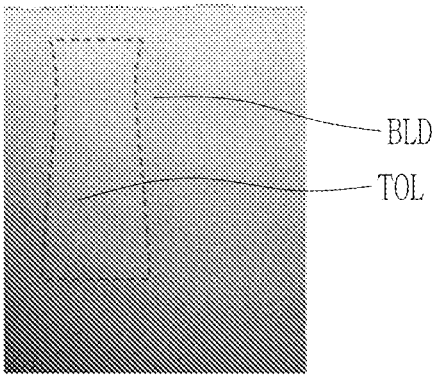
FIG. 15 and FIG. 16 are schematic photographs of a cross-section of a light-shielding linear pattern and an upper transparent organic layer of a light emitting display device according to an embodiment.
Figure 16:
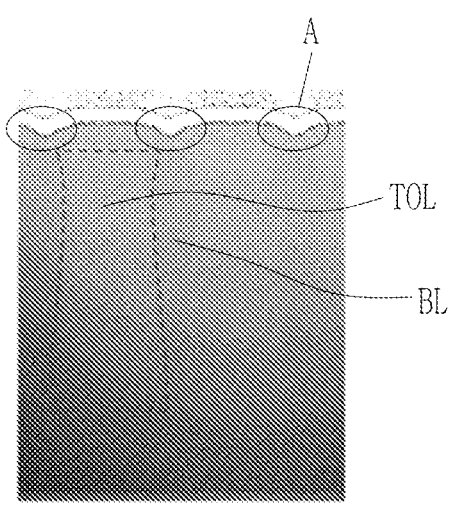

Referring to FIG. 4, the light-shielding linear pattern BL having a columnar shape and a structure with a constant width is also shown, but according to an embodiment, the width may be different depending on the height, and the width of the middle part may be thick and the width at the upper or lower parts may be thicker (see, e.g., FIG. 15 and FIG. 16).

Referring to FIG. 4, the upper portion of the light-shielding linear pattern BL may have a recess portion of a concave shape. The recess portion may be positioned on the center portion among the upper surface of the light-shielding linear pattern BL and may have a structure extending to be elongated along the extending direction of the light-shielding linear pattern BL. However, according to an embodiment, the recess portion may not extend and multiple recess portions may be formed on the upper surface of one light-shielding linear pattern BL.

The light-shielding linear pattern BL according to an embodiment of FIG. 4 may be formed thicker than the upper transparent organic layer TOL, so the height may be high, and the height may be formed by adding the thickness of the upper transparent inorganic layer TIL and the upper transparent organic layer TOL. For example, the highest upper surface of the light-shielding linear pattern BL may be positioned higher than the highest upper surface of the upper transparent organic layer TOL and be positioned further from the substrate.

The light-shielding linear pattern BL may function to block the light emitted from the emission layer EMLg from being emitted beyond a certain angle (0; hereafter referred to as a viewing angle) with respect to a normal line, and for this purpose, the height of the light-shielding linear pattern BL may be relatively large. The height of the light-shielding linear pattern BL according to an embodiment may be formed to be about 20 μm or more and about 50 μm or less, and in an embodiment, the height is formed to be about 23 μm. At this time, In FIG. 4, the width of the light-shielding linear pattern BL may be about 1 μm or more and about 3 μm or less, and in an embodiment, it is formed at about 2 μm. For example, in order to prevent light from being provided beyond a certain angle (0) with respect to the normal line, the light-shielding linear pattern BL is formed higher than the width, and the ratio of the height to the width may be about 16 or more and about 20 or less.

The interval between the light-shielding linear patterns BL may be determined based on an angle at which light is provided. For example, in case that the height of the light-shielding linear pattern BL is about 23 μm and the maximum angle θ through which light is transmitted is about 30 degrees, the interval between the light-shielding linear patterns BL may be determined based on a trigonometric function. Here, the interval between the adjacent light-shielding linear pattern BL may have a smaller value than the height of the light-shielding linear pattern BL, and may have a value of about 11 μm or more and about 29 μm or less.

As the distance between the light-shielding linear patterns BL approaches, the viewing angle (θ) at which light is blocked decreases, so the blocking effect increases, but there is a drawback that transmittance may deteriorate. Therefore, it is desirable to consider the transmittance and the blocked viewing angle θ together, and in an embodiment, the blocking viewing angle θ may be set to about 30 degrees while having transmittance of about 80%. On the other hand, in an embodiment in which the transmittance may be further reduced, the blocking viewing angle θ may be reduced to about 15 degrees. In an embodiment in which the transmittance should be high or the blocking viewing angle θ may be greater than about 30 degrees, it may be set so that light may not proceed at various angles, and the blocking viewing angle θ may be set to an angle of about 45 degrees.

The upper transparent organic layer TOL may be positioned between the light-shielding linear patterns BL, and the upper transparent organic layer TOL may be formed using a transparent organic material having a low refractive index. Various materials may be used as the transparent organic material, and about 1.47 may be used as the low refractive index used in an embodiment.

The thickness of the upper transparent organic layer TOL may have a thickness equivalent to the height of the light-shielding linear pattern BL, but according to an embodiment of FIG. 4, it may have a thickness as low as the thickness of the upper transparent inorganic layer TIL compared to the height of the light-shielding linear pattern BL.

The upper transparent inorganic layer TIL may be further positioned on the upper transparent organic layer TOL, and it may be removed according to an embodiment. The upper transparent inorganic layer TIL may be in partial contact with the upper surface of the light-shielding linear pattern BL, but may have a structure that may not overlap the light-shielding linear pattern BL in a plan view. The upper transparent inorganic layer TIL may be positioned in a portion that is above the upper transparent organic layer TOL and may not overlap the light-shielding linear pattern BL.

The upper transparent inorganic layer TIL may be formed by stacking an inorganic material such as a silicon oxide (SiOx) or a silicon nitride (SiNx), or may be formed of a transparent conductive oxide (TCO) such as ITO or IZO according to an embodiment.

An additional insulating layer may be positioned on the upper transparent inorganic layer TIL and the light-shielding linear pattern BL, and according to an embodiment, a polarizer may be attached with an adhesive on the upper transparent inorganic layer TIL and the light-shielding linear pattern BL.

In FIG. 4, the encapsulation layer 400 may be positioned under the upper transparent organic layer TOL, and the encapsulation layer 400 may have a structure including a lower inorganic encapsulation layer 401, an organic encapsulation layer 402, and an upper inorganic encapsulation layer 403.

The light emitting diode (LED) may be positioned under the encapsulation layer 400, and in FIG. 4, only the emission layer EMLg is shown briefly. The specific lower substructure is described with reference to FIG. 23 and FIG. 24.

According to an embodiment, a sensing insulating layer and multiple sensing electrodes may be positioned between the upper transparent inorganic layer TIL and the encapsulation layer 400 to sense a touch. A structure for sensing the touch is also described later in FIG. 23 and FIG. 24.

As described above, an embodiment of forming the light-shielding linear pattern BL in the light emitting display device may be different from a comparative example in which the viewing angle is reduced by attaching a film to the front surface of the light emitting display device at least in following points.

First, in case of attaching a film, a problem of a misalignment may occur, and a moiré phenomenon may occur in case of being attached incorrectly, however there may be no misalignment problem in the embodiment, and the moiré phenomenon may be readily removed by adjusting the interval of the light-shielding linear patterns BL.

The comparative example of attaching the film may increase the manufacturing cost, and there may be a drawback in that the transmittance is reduced due to an optical loss occurring at the interface due to the adhesive in case of attaching.

Referring to FIG. 3 and FIG. 4, some of multiple light-shielding linear patterns BL may overlap the light emitting diode (LED) or the emission layers EMLr, EMLg, and EMLb, and the remaining portions may overlap the pixel definition layer 380.

In an embodiment of FIG. 3 and FIG. 4, each emission layer EMLr, EMLg, and EMLb may overlap one light-shielding linear pattern BL, but the number and position of the overlapping light-shielding linear patterns BL may vary.

Figure 5:
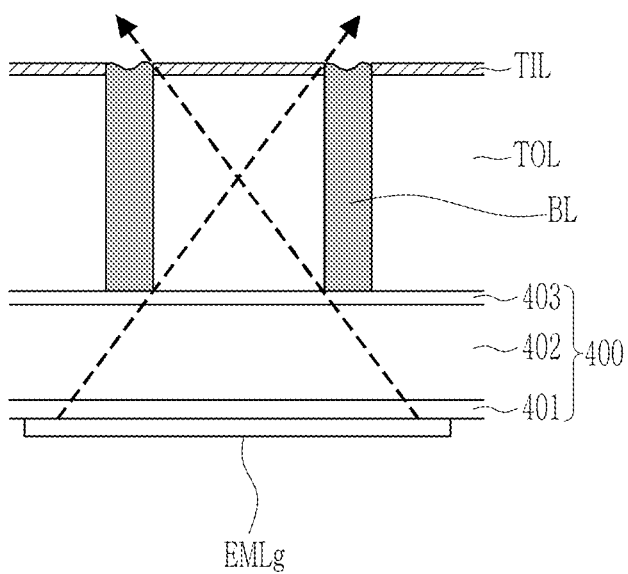
FIG. 5 is a schematic cross-sectional view of a light emitting display device according to another embodiment

An embodiment of the various arrangements of each emission layer EMLr, EMLg, and EMLb and/or the opening OPr, OPg, and OPb of the pixel definition layer 380, and the light-shielding linear pattern BL, is described through FIG. 5.

FIG. 5 is a schematic cross-sectional view of a light emitting display device according to another embodiment.

The embodiment of FIG. 5 is an embodiment in which one emission layer EMLg overlaps two light-shielding linear patterns BL unlike an embodiment of FIG. 3 and FIG. 4.

As shown in FIG. 5, even if two light-shielding linear patterns BL and the emission layer EMLg overlap, if the height and the distance of the light-shielding linear patterns BL are the same, the blocking viewing angle θ may be the same.

In FIG. 3 to FIG. 5, the light-shielding linear pattern BL may have a structure in which the light-shielding linear pattern BL passes through the center of the emission layer EMLg or is disposed in a symmetrical position with respect to the center line. However, according to an embodiment, the light-shielding linear pattern BL may be formed at a position that is not symmetrical with respect to the center line without passing through the center of the emission layer EMLg.

Hereinafter, the manufacturing method that forms the light-shielding linear pattern according to an embodiment is described in detail with reference to FIG. 6 to FIG. 12.

FIG. 6 to FIG. 12 are schematic views sequentially showing a manufacturing method that forms a light-shielding linear pattern and an upper transparent organic layer of a light emitting display device according to an embodiment.

In FIG. 6 to FIG. 12, only some of the layers positioned below are shown, and only the upper inorganic encapsulation layer 403 included in the encapsulation layer 400 is shown in FIG. 6 to FIG. 12.

Figure 6:
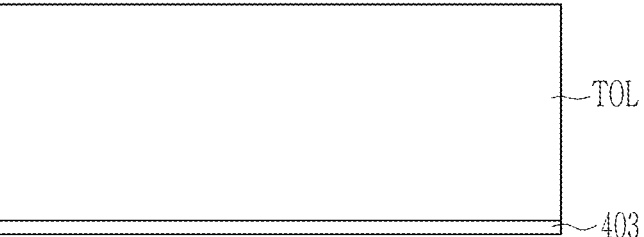
FIG. 6 to FIG. 12 are schematic views sequentially showing a manufacturing method for forming a light-shielding linear pattern and an upper transparent organic layer of a light emitting display device according to an embodiment.

Referring to FIG. 6, a transparent organic material with a low refractive index is coated to form an upper transparent organic layer TOL on the upper inorganic encapsulation layer 403. As the low refractive index transparent organic material, various transparent organic materials having a refractive index of about 1.47 may be used.

Figure 7:
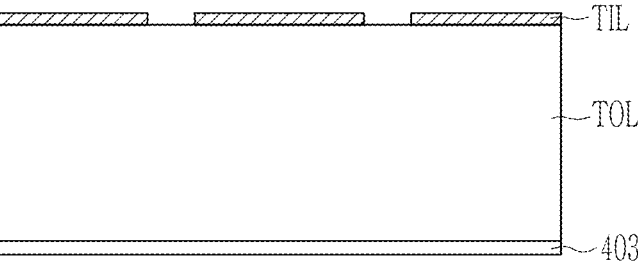

Next, as shown in FIG. 7, on the upper transparent organic layer TOL, an inorganic insulating material such as a silicon oxide (SiOx), a silicon nitride (SiNx), or a transparent conductive oxide (TCO) such as ITO or IZO may be deposited and etched to form an upper transparent inorganic layer TIL. Here, the upper transparent inorganic layer TIL may be formed through dry etching or wet etching after forming a photoresist pattern on the upper transparent inorganic layer TIL by using a mask and developing exposure. The upper transparent inorganic layer TIL may be formed in a structure that extends long along a direction, and is spaced apart by a predetermined or given interval between the adjacent upper transparent inorganic layers TIL. The part where the upper transparent inorganic layer TIL may not be formed may be the part where the light-shielding linear pattern BL is to be formed.

Figure 8:
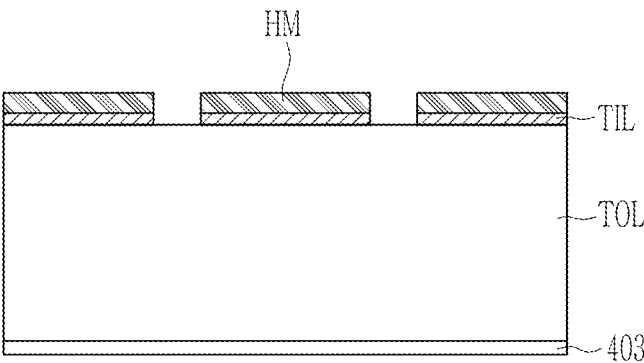

After that, as shown in FIG. 8, a hard mask HM having the same pattern as the upper transparent inorganic layer TIL may be formed on the upper transparent inorganic layer TIL. The hard mask HM may be formed of a metal such as aluminum (Al) or molybdenum (Mo) or an alloy thereof. In an embodiment of FIG. 8, since the pattern of the hard mask HM and the pattern of the upper transparent inorganic layer TIL are formed identically, they may be etched using the same mask. Here, the hard mask HM may be formed through dry etching or wet etching after forming a photoresist pattern on the upper part of the hard mask HM by using a mask and a developing exposure.

Figure 9:
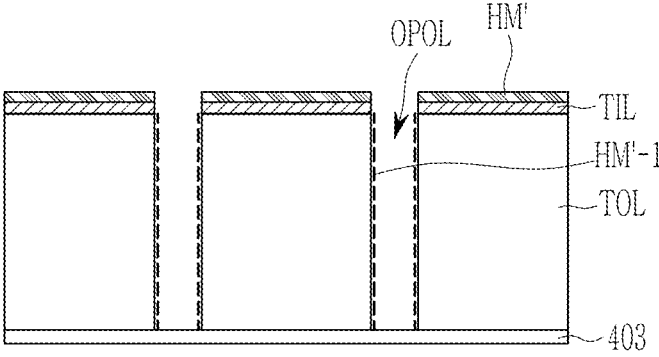

After that, as shown in FIG. 9, the upper transparent organic layer TOL may be completed by dry etching the transparent organic material by using the hard mask HM as a mask. As a result, an opening OPOL may be formed in the upper transparent organic layer TOL, and the opening OPOL according to an embodiment of FIG. 9 may not overlap the upper transparent inorganic layer TIL and the hard mask HM.

In FIG. 9, since the hard mask HM is dry etched as a mask, the height of the hard mask HM' may be lowered, and the by-product HM'-1 of which the hard mask HM' is etched may be adhered in the opening OPOL of the upper transparent organic layer TOL. In case that the by-product HM'-1 is positioned in the opening OPOL of the upper transparent organic layer TOL, there may be a problem that the light-shielding linear pattern BL is not normally formed in the subsequent process. These issues are discussed in detail in FIG. 13 and FIG. 14.

Figure 10:
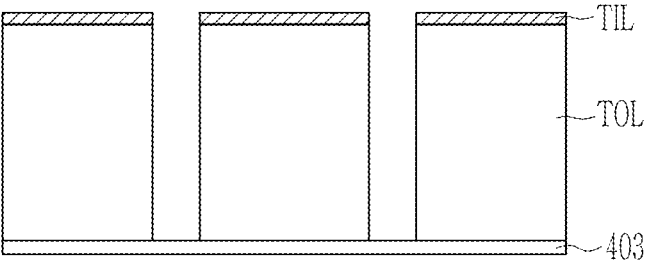

Accordingly, as shown in FIG. 10, in case of removing the hard mask HM' whose height has been lowered, the by-product HM'-1 positioned in the opening OPOL may also be removed. In FIG. 10, the by-product HM'-1 positioned in the opening OPOL may also be removed by performing the wet etching using an etchant that removes the hard mask HM'.

Referring to FIG. 9 and FIG. 10, the opening OPOL may be formed over the entire thickness of the upper transparent organic layer TOL, thereby exposing the underlying layer (the upper inorganic encapsulation layer 403 in FIG. 9). However, according to an embodiment, since the opening OPOL may also be formed on a part of the thickness of the upper transparent organic layer TOL, the underlying layer (the upper inorganic encapsulation layer 403 of FIG. 9) may not be exposed.

Figure 11:
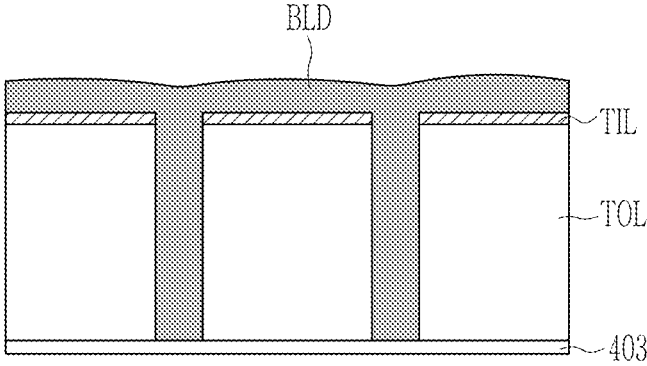

Next, as shown in FIG. 11, an organic material (BLD; hereinafter referred to as a light-shielding organic material) including a black color pigment may be coated on the entire region. The organic material BLD including the black color pigment coated to the entire region also may inflow into the opening OPOL of the upper transparent organic layer TOL to fill the opening OPOL of the upper transparent organic layer TOL with the organic material BLD. The organic material BLD may be coated in a sufficiently large amount to completely position the upper transparent inorganic layer TIL.

Here, the light-shielding organic material BLD may be a material (photoresist) that causes a chemical change in case irradiated with light. The black color pigment may include a light blocking material, and the light blocking material may include at least one of a carbon black, a carbon nanotube, a resin or a paste including a black dye, a metal particle, for example, nickel, aluminum, molybdenum, and an alloy thereof, or a metal oxide particle (for example, chromium nitride). The light-shielding organic material BLD may have a black color including a light-shielding material, and may have a characteristic that light is not reflected, but is absorbed/blocked.

Figure 12:
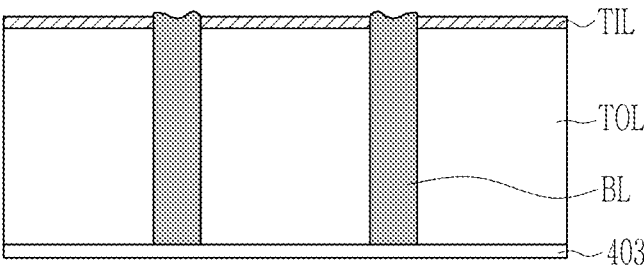

Next, as shown in FIG. 12, the process of developing the applied organic material BLD may be carried out.

During the developing process of the organic material BLD including the organic material, the part positioned close to the upper transparent organic layer TOL may not be removed in the development process due to the interaction between two organic materials, and the part separated from the upper transparent organic layer TOL by a certain distance may be removed by the developing process. As a result, the light-shielding linear pattern BL as shown in FIG. 12 may be formed, and the upper part of the light-shielding linear pattern BL may include a recess portion of a concave shape. Here, the recess portion may be positioned at the central portion of the upper surface of the light-shielding linear pattern BL, and may have a structure that extends long according to the extension direction of the light-shielding linear pattern BL. In such a recess portion structure, the central portion of the light-shielding linear pattern BL positioned far from the upper transparent organic layer TOL may be removed during the developing process, but the portion close to the upper transparent organic layer TOL may not be removed during the developing process, thereby this concave recess portion may be formed.

Since it is verifiable through an experiment that the upper recess portion of the light-shielding linear pattern BL may occur the same even in case that the developing process is performed for a long time, the light-shielding linear pattern BL formed through the process of FIG. 6 to FIG. 12 may basically have the recess portion on the upper portion.

The manufacturing method of the light-shielding linear pattern BL, the upper transparent organic layer TOL, and the upper transparent inorganic layer TIL according to an embodiment has been described in detail with reference to FIG. 6 to FIG. 12.

Hereinafter, the by-product HM'-1 and the resulting problems that occur in case dry etching the upper transparent organic layer TOL by using the hard mask HM as a mask are presented through FIG. 13 and FIG. 14.

Figure 13:
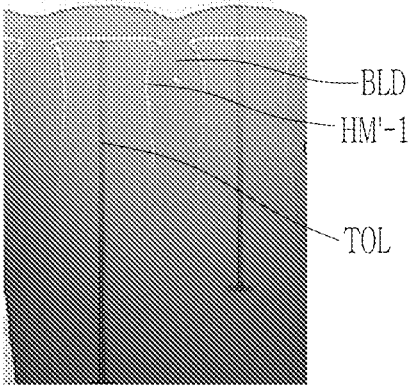
FIG. 13 and FIG. 14 are schematic photographs of a cross-section of a light-shielding linear pattern and an upper transparent organic layer of a light emitting display device according to a comparative example.
Figure 14:
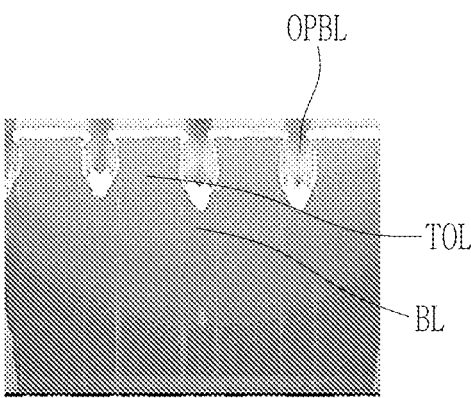

FIG. 13 and FIG. 14 are schematic photographs of a cross-section of a light-shielding linear pattern and an upper transparent organic layer of a light emitting display device according to a comparative example.

First, FIG. 13 is a photo taken during the process of the comparative example, and a cross-section picture taken after coating the organic material BLD including the black color pigment to the entire region without removing the by-product HM'-1 generated during the dry etching by using the hard mask HM as a mask. Here, the hard mask HM may use aluminum (Al), and the by-product HM'-1 may be formed of aluminum oxide.

As shown in FIG. 13, in case that the organic material BLD is developed in the state including the by-product HM'-1, the light-shielding linear pattern BL may be formed in the same structure as in FIG. 14.

In FIG. 14, an empty space OPBL may be formed on the light-shielding linear pattern BL so that the height of the light-shielding linear pattern BL is smaller than the upper transparent organic layer TOL and is positioned at a distance from the upper transparent inorganic layer TIL.

As shown in FIG. 14, the reason that the empty space OPBL is formed may be that the organic material BLD is removed during the developing process, and this may be because the interaction between the upper transparent organic layer TOL and the organic material BLD is interrupted by the by-product HM'-1 positioned between them, and may be removed instead of remaining in the developing process.

Therefore, in FIG. 10, in case of removing the hard mask HM' through the wet etching process, the by-product HM'-1 positioned within the opening OPOL may also be removed so that the light-shielding linear pattern BL may not be formed with a small height.

Hereinafter, photos taken of the light-shielding linear pattern BL and the upper transparent organic layer TOL according to an embodiment are described through FIG. 15 and FIG. 16.

FIG. 15 and FIG. 16 are schematic photographs of a cross-section of a light-shielding linear pattern and an upper transparent organic layer of a light emitting display device according to an embodiment.

First, FIG. 15 is a picture taken during the process of an embodiment, and is the cross-section picture taken after removing the by-product HM'-1 generated in case of performing the dry etching by using the hard mask HM as a mask, and coating the organic material BLD including the black color pigment to the entire region. Here, aluminum (Al) may be used for the hard mask HM, and the generated by-product HM'-1 may be aluminum oxide.

In the picture of FIG. 15, the boundary between the upper transparent organic layer TOL and the organic material BLD may not be clearly visible, so the boundary is drawn with a dotted line.

Referring to the dotted line representing the upper transparent organic layer TOL of FIG. 15, it may be indirectly confirmed that the opening OPOL formed in the upper transparent organic layer TOL has the opening OPOL with the width that is not constant without being formed while having the same width as shown in FIG. 10. For example, based on FIG. 15, the opening OPOL may have a structure in which the width is narrow at the upper part, gradually increases, and the width decreases again.

After that, in case that the development process proceeds, it may have the same structure as that of FIG. 16.

Referring to the part A of FIG. 16, it may be seen that the recess portion may be formed on the upper portion of the light-shielding linear pattern BL, and the recess portion may be positioned in the middle of the adjacent upper transparent organic layer TOL. This may be the reason that it remains in the developing process due to the interaction between the two organic materials in the portion where the upper transparent organic layer TOL and the organic material BLD are close to each other, but the organic material BLD positioned far from the upper transparent organic layer TOL may be removed during the development because no interaction between two organic materials occurs.

In the above, the effect of the disclosure may be specifically examined by comparing the comparative example and an embodiment.

Hereinafter, at least some of the steps of FIG. 6 to FIG. 12 may be carried out through a different process, and this variant embodiment is described through FIG. 17 and FIG. 18.

Figure 17:
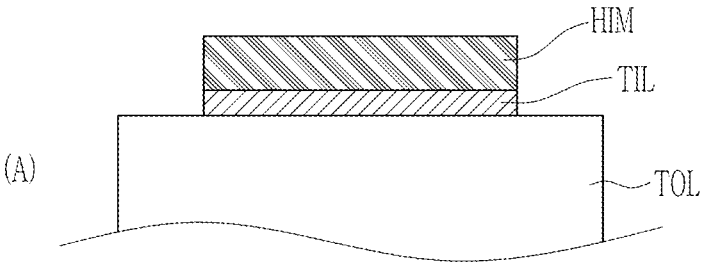
FIG. 17 and FIG. 18 are views schematically showing a structure in which a mask is formed according to another embodiment among a manufacturing method that forms a light-shielding linear pattern and an upper transparent organic layer of a light emitting display device.
Figure 17:
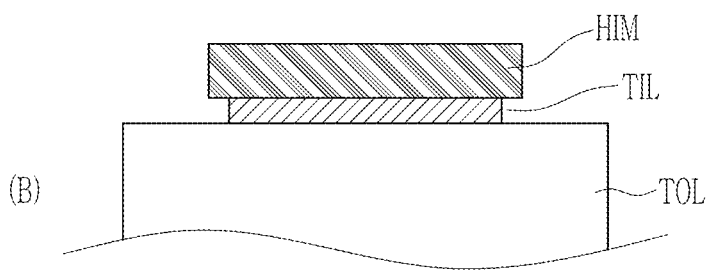
Figure 18:
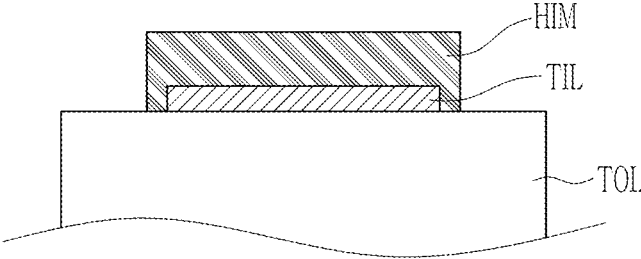

FIG. 17 and FIG. 18 are views schematically showing a structure in which a mask is formed according to another embodiment among a manufacturing method that forms a light-shielding linear pattern and an upper transparent organic layer of a light emitting display device.

FIG. 17 and FIG. 18 is an embodiment transforming the step of FIG. 7 and FIG. 8, FIG. 17 is an embodiment for forming the upper transparent inorganic layer TIL and the hard mask HM by using one mask, and FIG. 18 is an embodiment in which the upper transparent inorganic layer TIL and the hard mask HM are formed by using two different masks.

First, FIG. 17 (A) is described.

FIG. 17 (A) is an embodiment in which the upper transparent inorganic layer TIL and the hard mask HM may be simultaneously dry-etched to be formed by using one mask unlike FIG. 7 and FIG. 8.

For example, the inorganic material such as a silicon oxide (SiOx) and a silicon nitride (SiNx), which is the material for forming the upper transparent inorganic layer TIL, or the transparent conductive oxide (TCO) such as ITO or IZO may be stacked on the transparent organic material of a low refractive index for forming the upper transparent organic layer TOL, and a metal such as aluminum (Al) or molybdenum (Mo), which is the material for forming the hard mask HM, or an alloy thereof, may be continuously stacked thereon.

Next, a photoresist pattern may be formed by using a mask on the hard mask HM and the dry-etching may be performed to form the same structure as FIG. 17 (A). As a result, the upper transparent inorganic layer TIL and the hard mask HM may have substantially the same boundary.

On the other hand, FIG. 17 (B) is an embodiment in which the upper transparent inorganic layer TIL and the hard mask HM may be simultaneously formed through the wet-etching by using one mask.

For example, the transparent conductive oxide (TCO) such as ITO or IZO, which is the material for forming the upper transparent inorganic layer TIL, may be stacked on the transparent organic material of a low refractive index to form the upper transparent organic layer TOL, and aluminum (Al) or the alloy of aluminum (Al), which is the material for forming the hard mask HM, may be continuously stacked.

Next, a photoresist pattern may be formed by using a mask on the hard mask HM, and the wet etching may be performed by applying an etchant to form the same structure as shown in FIG. 17 (B). Referring to FIG. 17 (B), the upper transparent inorganic layer TIL and the hard mask HM may have different boundaries, and the upper transparent inorganic layer TIL positioned below may be undercut and may have the narrower width than the hard mask HM.

Hereinafter, an embodiment of forming the upper transparent inorganic layer TIL and the hard mask HM by using two different masks is described through FIG. 18.

In an embodiment of FIG. 18 as shown in FIG. 7, on the upper transparent organic layer TOL, the inorganic material such as a silicon oxide (SiOx) or a silicon nitride (SiNx) or the transparent conductive oxide (TCO) such as ITO or IZO may be stacked and etched by using a first mask to form the upper transparent inorganic layer TIL.

After that, a metal such as aluminum (Al) or molybdenum (Mo) or an alloy thereof, which is the material for forming the hard mask HM, may be stacked, and etched by using a second mask to form the hard mask HM.

At this time, referring to FIG. 18, the pattern width of the upper transparent inorganic layer TIL formed compared to the first mask may be narrower than the pattern width of the hard mask HM formed by the second mask, so the hard mask HM has the structure in which the side surface may be covered in addition to the upper surface of the upper transparent inorganic layer TIL.

FIG. 17 and FIG. 18 are classified based on the number of masks, but they may be classified based on the width of the hard mask HM and the width of the upper transparent inorganic layer TIL as follows.

In an embodiment of FIG. 7 and FIG. 8 and an embodiment of FIG. 17 (A), the hard mask HM and the upper transparent inorganic layer TIL may have the same width.

On the other hand, the embodiment of FIG. 17 (B) and FIG. 18 is an embodiment in which the width of the hard mask HM may be larger than the width of the upper transparent inorganic layer TIL.

Figure 19:
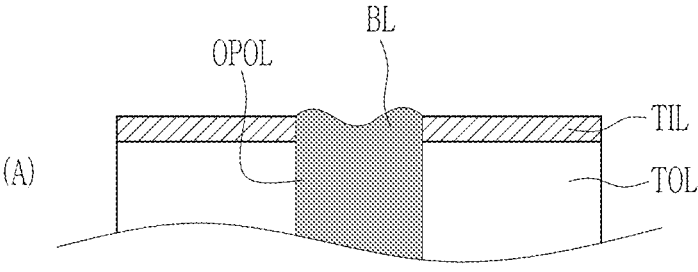
FIG. 19 is a view schematically showing an upper part of a light-shielding linear pattern and an upper transparent organic layer of a light emitting display device formed according to another embodiment.
Figure 19:
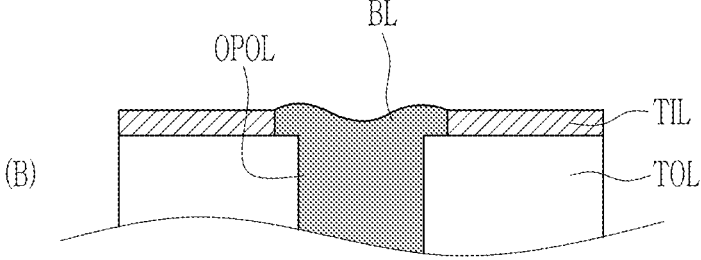

This distinction may be caused by a difference in the structure of the upper part of the light-shielding linear pattern BL formed in a subsequent process, and the structural difference is described in detail in FIG. 19.

FIG. 19 is a schematic view showing an upper part of a light-shielding linear pattern and an upper transparent organic layer of a light emitting display device formed according to another embodiment.

An embodiment of FIG. 19 (A) is a structure in which the light-shielding linear pattern BL may only be positioned within the opening OPOL formed in the upper transparent organic layer TOL and may not overlap the upper surface of the upper transparent organic layer TOL. For example, according to an embodiment, the light-shielding linear pattern BL in a plan view may not overlap the upper transparent organic layer TOL and the upper transparent inorganic layer TIL.

The part where the upper transparent inorganic layer TIL and the upper transparent organic layer TOL contact each other may have the same width, like an embodiment of FIG. 7 and FIG. 8 and an embodiment of FIG. 17 (A), and the light-shielding linear pattern BL formed in an embodiment in which the hard mask HM and the upper transparent inorganic layer TIL may be formed with the same width may be the same structure as that of FIG. 19 (A). At this time, the recess portion may be formed in the upper portion of the light-shielding linear pattern B L.

On the other hand, the embodiment of FIG. 19 (B) is a structure in which the light-shielding linear pattern BL may also be positioned on the upper transparent organic layer TOL and may have a structure that may not overlap the upper surface of the upper transparent organic layer TOL.

The upper transparent inorganic layer TIL may have the narrower width than the upper transparent organic layer TOL, and the light-shielding linear pattern BL may be formed on the upper transparent organic layer TOL not covered by the upper transparent inorganic layer TIL.

The light-shielding linear pattern BL having the structure of FIG. 19 (B) may be a light-shielding linear pattern BL formed through an embodiment where the width of the hard mask HM may be larger than the width of the upper transparent inorganic layer TIL like an embodiment of FIG. 17 (B) and FIG. 18. At this time, the recess portion is formed on the upper portion of the light-shielding linear pattern BL.

Figure 20:
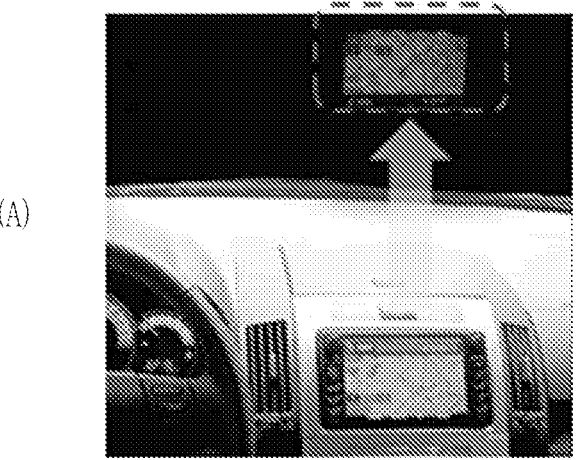
FIG. 20 is a view schematically showing a case where a light emitting display device according to a comparative example is applied to a vehicle.
Figure 20:
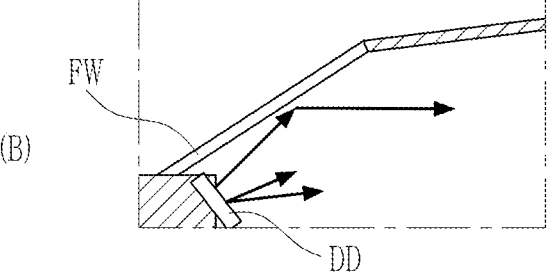
Figure 21:
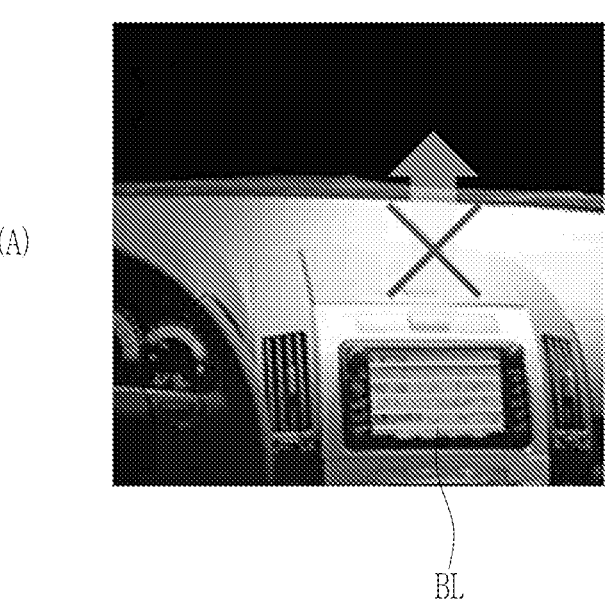
FIG. 21 is a view schematically showing a case where a light emitting display device according to an embodiment is applied to a vehicle.
Figure 21:
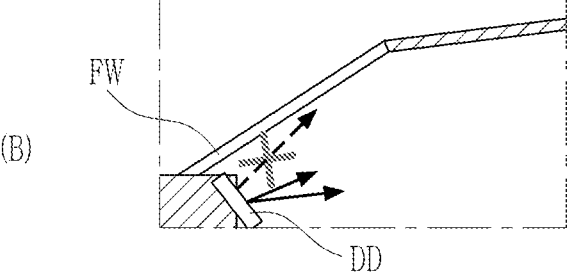

An effect that may be obtained in case that the light emitting display device having the above structure and including the light-shielding linear pattern BL formed through the manufacturing method is applied to a vehicle is described through FIG. 21 while comparing with a comparative example in FIG. 20.

FIG. 20 is a view schematically showing a case where a light emitting display device according to a comparative example is applied to a vehicle, and FIG. 21 is a view schematically showing a case of a light emitting display device according to an embodiment.

In a comparative example of FIG. 20, a light emitting display device DD used in a vehicle may not include a light-shielding linear pattern BL, as shown in FIG. 20 (B), the angle of the emitted light is not limited and may be emitted in various directions.

On the other hand, in an embodiment of FIG. 21, a light emitting display device DD used in a vehicle may include multiple light-shielding linear patterns BL arranged in a direction (a horizontal direction) to partially block light emitted in the vertical direction. Light of about 30 degrees or more may be blocked based on a vertical normal to the front surface of the light emitting display device DD.

Referring to FIG. 20, the light emitted from the light emitting display device DD located in the center fascia of the vehicle is also provided to the front glass FW of the vehicle, and at night, the light emitted from the light emitting display device DD is reflected from the front glass FW and applied to the driver's eyes, thereby causing problems that the driver's view may be obstructed.

On the other hand, referring to FIG. 21, the light emitting display device DD used in the vehicle has multiple light-shielding linear patterns BL so that the light emitted from the light emitting display device DD may not be transmitted to the front glass FW of the vehicle and may not be reflected to the front glass FW even at night and may not obstruct the driver's view.

According to an embodiment, the arrangement direction of the light emitting display device DD and multiple light-shielding linear patterns BL used in the vehicle may be varied, and one embodiment of such arrangements is described with reference to FIG. 22.

Figure 22:
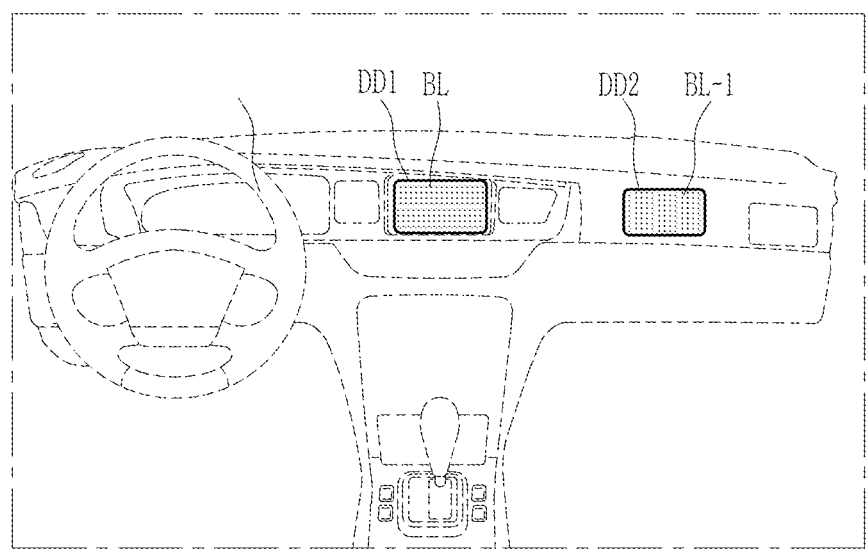
FIG. 22 is a view schematically showing a case where a light emitting display device according to another embodiment is applied to a vehicle.

FIG. 22 is a view schematically showing a case of a light emitting display device according to another embodiment.

The vehicle according to the embodiment of FIG. 22 is equipped with two light emitting display devices DD1 and DD2.

The first light emitting display device DD1, as shown in FIG. 21, may be positioned on the center fascia and may have multiple light-shielding linear patterns BL arranged in the horizontal direction. The result is that the light is not reflected on the front glass and may not obstruct the driver's view.

The second light emitting display device DD2 may be positioned in front of the passenger seat and may have multiple light-shielding linear patterns BL-1 arranged in a vertical direction. Due to multiple light-shielding linear patterns BL-1 arranged in the vertical direction, since the light emitted from the second light emitting display device DD2 is not provided in the left and right directions, only the person sitting in the passenger seat may see the screen of the second light emitting display device DD2, and the driver may not see the screen of the second light emitting display device DD2. As a result, there may be a benefit in that the driver may focus on driving without worrying about the second light emitting display device DD2 while driving.

In the above, along with the schematic structure of the light emitting display device, the light-shielding linear pattern BL, the surrounding structure, and the manufacturing method were examined in detail.

Hereinafter, the structure of the light emitting diode (LED) positioned under the light-shielding linear pattern BL is described in more detail through FIG. 23 and FIG. 24.

Figure 23:
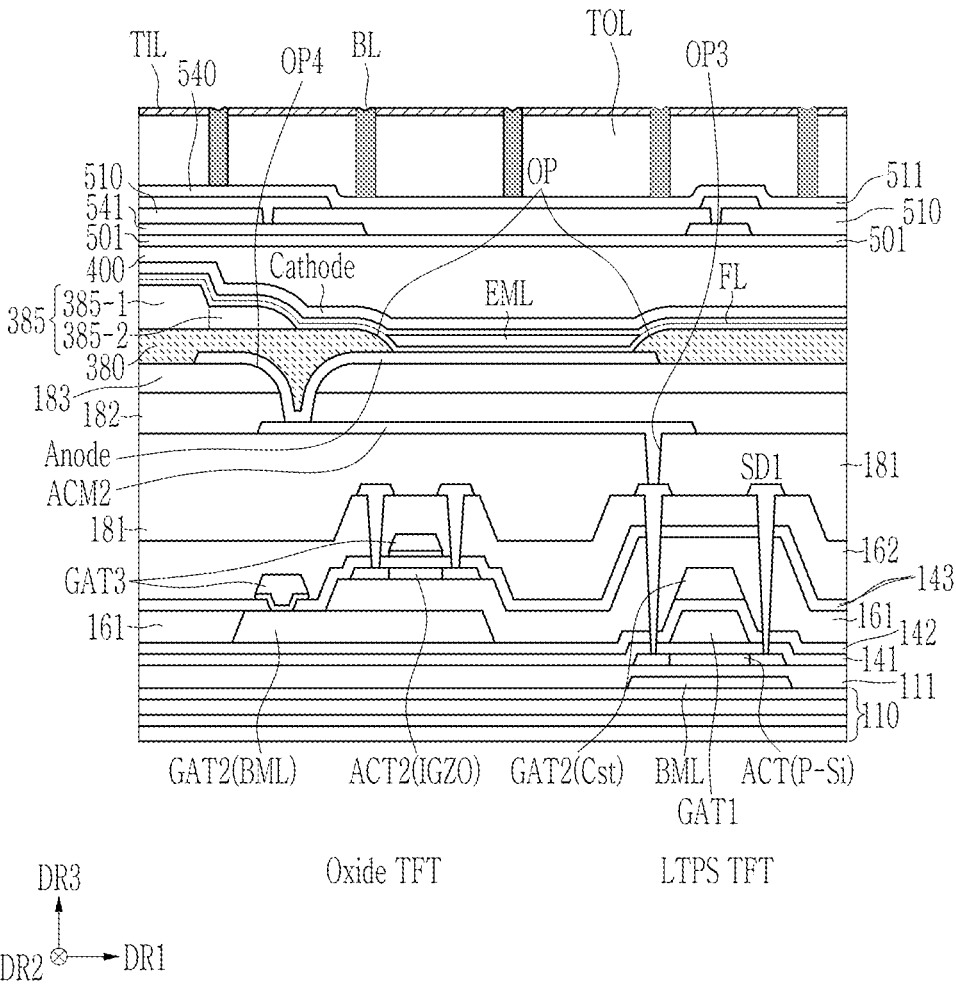
FIG. 23 and FIG. 24 are views schematically showing a cross-section structure of a light emitting display device of each embodiment.
Figure 24:
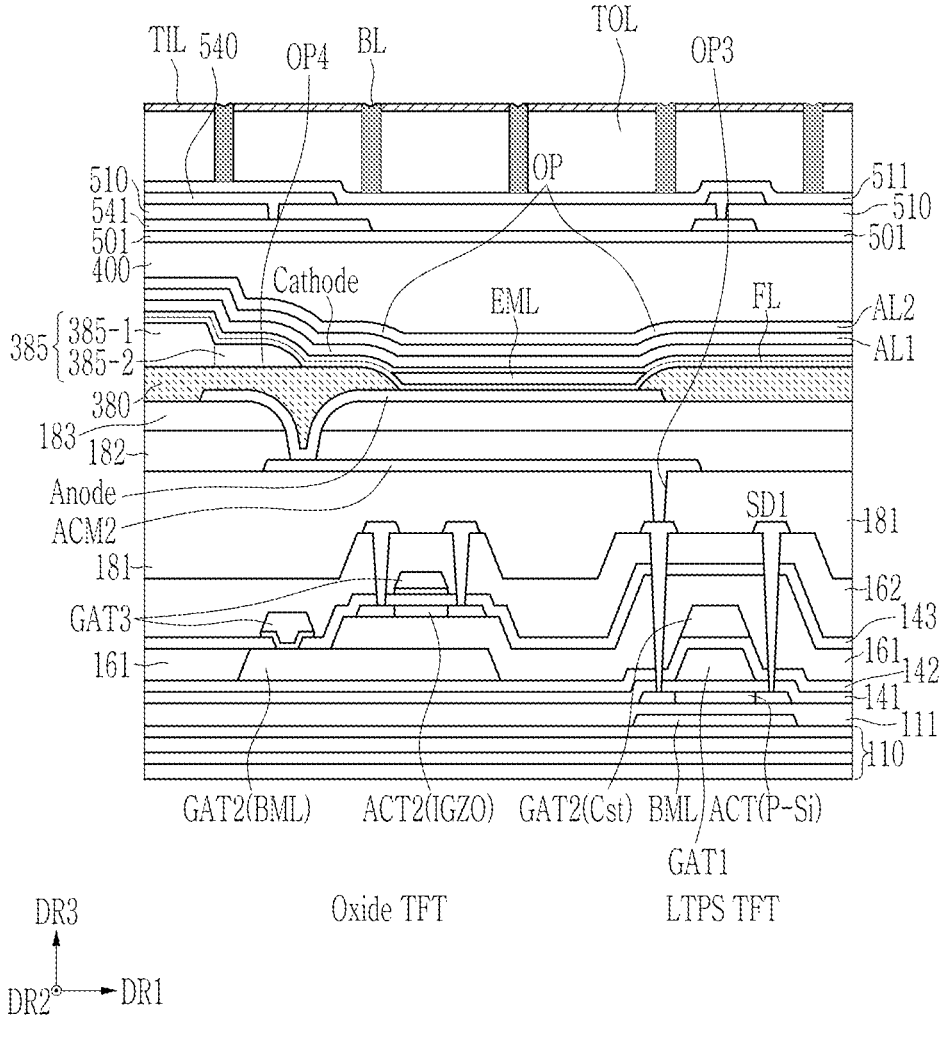

FIG. 23 and FIG. 24 are views schematically showing a cross-section structure of a light emitting display device of each embodiment.

First, FIG. 23 shows a stacked structure of the pixel positioned in the display area among the light emitting display device.

The light emitting display device may be largely divided into a lower panel layer and an upper panel layer, and the lower panel layer may be a part in which the light emitting diode (LED) and a pixel circuit unit constituting the pixel may be positioned, and may include up to an encapsulation layer 400 covering it. Here, the pixel circuit unit may include a second organic layer 182 and a third organic layer 183 and means the configuration thereunder, and the light emitting diode (LED) may be the configuration positioned on the third organic layer 183 and below the encapsulation layer 400. The structure positioned on top of the encapsulation layer 400 may correspond to the upper panel layer, and multiple light-shielding linear patterns BL may also be included in the upper panel layer. According to an embodiment, the third organic layer 183 may not be included.

Referring to FIG. 23, a metal layer BML may be positioned on the substrate 110.

The substrate 110 may include a material that may not bend due to a rigid characteristic such as glass, or a flexible material that may be bent, such as plastic or polyimide. The case of the flexible substrate, FIG. 23, it may have a double structure in which a double-layered structure of polyimide and a barrier layer formed of an inorganic insulating material thereon is formed.

The metal layer BML may be formed at a position overlapping the channel of the driving transistor in a plan view among the first semiconductor layer ACT (P—Si) to be subsequent, and may also be referred to as a lower shielding layer. The metal layer BML may include a metal such as copper (Cu), molybdenum (Mo), aluminum (Al), titanium (Ti), and/or a metal alloy. Here, the driving transistor may mean a transistor that generates a current transmitted to the light emitting diode (LED).

On the substrate 110 and the metal layer BML, a buffer layer 111 covering them may be positioned. The buffer layer 111 may serve to block a penetration of impurity elements into the first semiconductor layer ACT (P—Si), and may be an inorganic insulating layer including a silicon oxide (SiOx), a silicon nitride (SiNx), a silicon oxynitride (Si-$O_xN_y$), etc.

A first semiconductor layer ACT (P—Si) formed of a silicon semiconductor (e.g., a polycrystalline semiconductor (P—Si)) may be positioned on the buffer layer 111. The first semiconductor layer ACT (P—Si) may include a channel of a polycrystalline transistor LTPS TFT including the driving transistor, and a first region and a second region positioned on both sides thereof. Here, the polycrystalline transistor LTPS TFT may include various switching transistors as well as the driving transistor. Both sides of the channel of the first semiconductor layer ACT (P—Si) have a region having a conductive layer characteristic by a plasma treatment or doping, so that they may serve as the first electrode and the second electrode of the transistor.

A first gate insulating layer 141 may be positioned on the first semiconductor layer ACT (P—Si). The first gate insulating layer 141 may be an inorganic insulating layer including a silicon oxide (SiOx), a silicon nitride (SiNx), or a silicon oxynitride (SiO$_x$N$_y$).

On the first gate insulating layer 141, a first gate conductive layer including a gate electrode GAT1 of the polycrystalline transistor LTPS TFT may be positioned. In the first gate conductive layer, a scan line or a light emitting control line may be formed in addition to the gate electrode GAT1 of the polycrystalline transistor LTPS TFT. The first gate conductive layer may include a metal such as copper (Cu), molybdenum (Mo), aluminum (Al), titanium (Ti), or a metal alloy, and may be configured as a single layer or multiple layers.

After forming the first gate conductive layer, a plasma treatment or a doping process is performed to make the exposed region of the first semiconductor layer conductive. For example, the first semiconductor layer ACT (P—Si) covered by the first gate conductive layer is not conductive, and the portion of the first semiconductor layer ACT (P—Si) not covered by the first gate conductive layer may have the same characteristic as the conductive layer.

A second gate insulating layer 142 may be positioned on the first gate conductive layer and the first gate insulating layer 141. The second gate insulating layer 142 may be an inorganic insulating layer including a silicon oxide (SiOx), a silicon nitride (SiNx), a silicon oxynitride (SiO$_x$N$_y$), and/or the like.

On the second gate insulating layer 142, a second gate conductive layer GAT2 including one electrode GAT2 (Cst) of the storage capacitor Cst and a lower shielding layer GAT2 (BML) of the oxide transistor Oxide TFT may be positioned. The lower shielding layer GAT2 (BML) of the oxide transistor oxide TFT may be positioned below the channel of the oxide transistor oxide TFT, respectively, and may serve to shield from optical or electromagnetic interference provided to the channel from the lower side. An electrode GAT2 (Cst) of the storage capacitor Cst may overlap the gate electrode GAT1 of the driving transistor, thereby forming the storage capacitor Cst. According to an embodiment, the second gate conductive layer GAT2 may further include a scan line, a control line, or a voltage line. The second gate conductive layer GAT2 may include a metal such as copper (Cu), molybdenum (Mo), aluminum (Al), titanium (Ti), or a metal alloy, and may be configured as a single layer or multiple layers.

A first interlayer insulating layer 161 may be positioned on the second gate conductive layer GAT2. The first interlayer insulating layer 161 may include an inorganic insulating layer including a silicon oxide (SiOx), a silicon nitride (SiNx), a silicon oxynitride (SiO$_x$N$_y$), and the like, and according to an embodiment, the inorganic insulating material may be thickly formed.

On the first interlayer insulating layer 161, an oxide semiconductor layer ACT2 (IGZO) (referred to as a second semiconductor layer) including a channel, a first region, and a second region of the oxide transistor Oxide TFT may be positioned.

A third gate insulating layer 143 may be positioned on the oxide semiconductor layer ACT2 (IGZO). The third gate insulating layer 143 may be positioned on the entire surface of the oxide semiconductor layer ACT2 (IGZO) and the first interlayer insulating layer 161. The third gate insulating layer 143 may include an inorganic insulating layer including a silicon oxide (SiOx), a silicon nitride (SiNx), a silicon oxynitride (SiO$_x$N$_y$), and/or the like.

A third gate conductive layer including the gate electrode GAT3 of the oxide transistor oxide TFT may be positioned on the third gate insulating layer 143. The gate electrode GAT3 of the oxide transistor oxide TFT may overlap the channel. The third gate conductive layer may further include a scan line or a control line. The third gate conductive layer may include a metal such as copper (Cu), molybdenum (Mo), aluminum (Al), titanium (Ti), and/or a metal alloy, and may be configured as a single layer or multiple layers.

A second interlayer insulating layer 162 may be positioned on the third gate conductive layer. The second interlayer insulating layer 162 may have a single-layer or multilayered structure. The second interlayer insulating layer 162 may include an inorganic insulating material such as a silicon nitride (SiNx), a silicon oxide (SiOx), and/or a silicon oxynitride ($SiO_xN_y$), and may include an organic material according to an embodiment.

On the second interlayer insulating layer 162, a first data conductive layer SD1 including a connecting member that may be connected to the first region and the second region of each of the polycrystalline transistor LTPS TFT and the oxide transistor Oxide TFT may be positioned. The first data conductive layer SD1 may include a metal such as aluminum (Al), copper (Cu), molybdenum (Mo), titanium (Ti), or a metal alloy, and may be configured as a single layer or multiple layers.

A first organic layer 181 may be positioned on the first data conductive layer SD1. The first organic layer 181 may be an organic insulator including an organic material, and the organic material may include at least one material selected from a group consisting of polyimide, polyamide, acryl resin, benzocyclobutene, and phenol resin.

A second data conductive layer including an anode connecting member ACM2 may be positioned on the first organic layer 181. The second data conductive layer may include a data line or a driving voltage line. The second data conductive layer may include a metal such as aluminum (Al), copper (Cu), molybdenum (Mo), titanium (Ti), or a metal alloy, and may be configured as a single layer or multiple layers. The anode connecting member ACM2 may be connected to the first data conductive layer SD1 through the opening OP3 positioned on the first organic layer 181.

The second organic layer 182 and the third organic layer 183 may be positioned on the second data conductive layer, and the second organic layer 182 and the third organic layer 183 may include an anode connection opening OP4. The anode connecting member ACM2 may be electrically connected to the anode Anode through the anode connection opening OP4. The second organic layer 182 and the third organic layer 183 may be an organic insulator, and may include at least one material selected from the group consisting of polyimide, polyamide, acryl resin, benzocyclobutene, and phenol resin. According to an embodiment, the third organic layer 183 may be omitted.

On the anode Anode, a pixel definition layer 380 covering at least a part of the anode Anode having an opening OP exposing the anode Anode may be positioned. The pixel definition layer 380 may be a black pixel definition layer formed of an organic material with a black color so that light applied from the outside may not be reflected back to the outside, and according to an embodiment, it may be formed of a transparent organic material. According to an embodiment, the black pixel definition layer 380 may include an organic material of a negative-type black color, and may include a black color pigment.

A spacer 385 may be positioned on the pixel definition layer 380. Unlike the pixel definition layer 380, the spacer 385 may be formed of a transparent organic insulating material. According to an embodiment, the spacer 385 may be formed of a positive-type transparent organic material. The spacer 385 may include two parts 385-1 and 385-2 with different heights, the high part 385-1 may act as a spacer, and the low height part 385-2 may serve as a spacer. It may thereby be possible to improve the adhesion characteristics between the spacer and the pixel definition layer 380.

On the anode Anode, the spacer 385, and the pixel definition layer 380, a functional layer FL and a cathode Cathode may be sequentially formed, and in the display area DA, the functional layer FL and the cathode Cathode may be positioned over the entire area. The emission layer EML may be positioned between the functional layers FL, and the emission layer EML may be positioned only within the opening OP of the pixel definition layer 380. Hereinafter, a combination of the functional layer FL and the emission layer EML may b e referred to as an intermediate layer. The functional layer FL may include at least one of an auxiliary layer such as an electron injection layer, an electron transport layer, a hole transport layer, and a hole injection layer, wherein the hole injection layer and the hole transport layer may be positioned under the emission layer EML, and the electron transport layer and the electron injection layer may be positioned on the emission layer EML.

An encapsulation layer 400 may be positioned on the cathode Cathode. The encapsulation layer 400 may include at least one inorganic layer and at least one organic layer, and like an embodiment of FIG. 4, may have a triple-layer structure including a first inorganic encapsulation layer, an organic encapsulation layer, and a second inorganic encapsulation layer. The encapsulation layer 400 may be for protecting the emission layer EML from moisture or oxygen that may be inflowed from the outside. According to an embodiment, the encapsulation layer 400 may include a structure in which an inorganic layer and an organic layer are sequentially further stacked.

Sensing insulating layers 501, 510, and 511 and multiple sensing electrodes 540 and 541 for touch sensing may be positioned on the encapsulation layer 400. In the embodiment of FIG. 23, the touch may be sensed in a capacitive type using two sensing electrodes 540 and 541.

Specifically, the first sensing insulating layer 501 may be formed on the encapsulation layer 400, and multiple sensing electrodes 540 and 541 may be formed thereon. Multiple sensing electrodes 540 and 541 may be insulated via the second sensing insulating layer 510 interposed therebetween, and the portions may be electrically connected through the opening positioned on the sensing insulating layer 510. Here, the sensing electrodes 540 and 541 may include a metal or metal alloy such as aluminum (Al), copper (Cu), silver (Ag), gold (Au), molybdenum (Mo), titanium (Ti), tantalum (Ta), etc., and may be composed of a single layer or multiple layers. The third sensing insulating layer 511 may be formed on the sensing electrode 540.

Multiple light-shielding linear patterns BL may be formed on the third sensing insulating layer 511. For example, on the third sensing insulating layer 511, the upper transparent organic layer TOL and multiple light-shielding linear patterns BL may be positioned, and the upper transparent inorganic layer TIL may be positioned on the upper transparent organic layer TOL where multiple light-shielding linear patterns BL may not be positioned. The upper transparent organic layer TOL, the upper transparent inorganic layer TIL, and the light-shielding linear pattern BL positioned on the third sensing insulating layer 511 may also be applied to the numerous variations embodiments as described in FIG. 1 to FIG. 22, and the upper transparent inorganic layer TIL may be omitted according to an embodiment.

A light blocking member, a color filter, and/or a color conversion layer may not be separately formed due to multiple light-shielding linear patterns BL. However, according to an embodiment, if desirable, they may be additionally formed above or below multiple light-shielding linear patterns BL.

It is also possible to include a polarizer on multiple light-shielding linear patterns BL according to an embodiment. However, in an embodiment in which the pixel definition layer 380 is formed to include the black pigment, a polarizer may not be used.

Multiple light-shielding linear patterns BL and the upper transparent inorganic layer TIL may be covered with an additional organic layer (also called a planarization film) to flatten the entire surface of the light emitting display device.

In FIG. 23, an embodiment in which a total of three organic layers may be formed, and the anode connection opening may be formed in the second organic layer and the third organic layer, was described. However, at least two organic layers may be formed, and the anode connection opening may be positioned in the upper organic layer positioned away from the substrate, and the lower organic layer opening may be positioned in the lower organic layer.

On the other hand, an embodiment of FIG. 23 may also constitute numerous embodiment variations, one of which is described through FIG. 24.

In the embodiment of FIG. 24, the material included in the upper transparent organic layer TOL may be formed so as to selectively absorb light of a wavelength of some band among the light reflected from the inside of the display device or the light incident outside the display device. A material (hereinafter, referred to as a reflection adjustment material) that is included in the upper transparent organic layer TOL and may absorb light of some wavelength may have following characteristics.

The reflection adjustment material absorbs the first wavelength region of about 490 nm to about 505 nm and the second wavelength region of about 585 nm to about 600 nm, so that the light transmittance in the first wavelength region and the second wavelength region may be about 40% or less. The reflection adjustment material may absorb light with a wavelength outside a red, green, or blue emission wavelength range emitted by the light emitting diode (LED). As such, the reflection adjustment material absorbs light of the wavelength that may not belong to the wavelength range of red, green, or blue emitted from the light emitting diode (LED), thereby preventing or minimizing the decreasing in the luminance of the display device and simultaneously preventing or minimizing the deterioration of the luminous efficiency of the display device, and improving visibility.

In an embodiment, the reflection adjustment material may be provided with a layer of the organic material including a dye, a pigment, or a combination thereof. The reflection adjustment material may include a tetraazaporphyrin (TAP) compound, a porphyrin compound, a metal porphyrin compound, an oxazine compound, a squarylium compound, a triarylmethane compound, a polymethine compound, an anthraquinone compound, a phthalocyanine compound, an azo compound, a perylene compound, a xanthene compound, a diimmonium compound, a dipyrromethene compound, a cyanine compound, and combinations thereof.

In an embodiment, reflectance measured in a SCI (Specular Component Included) mode on the reflection adjustment material surface may be 10% or less. For example, the reflection adjustment material may absorb external light reflection of the display device, so that the visibility may be improved.

In an embodiment, the reflection adjustment material may have transmittance of about 64% to about 72%. The transmittance of the reflection adjustment material may be adjusted according to the content of pigment and/or dye included in the reflection adjustment material.

In an embodiment including the reflection adjustment material, a capping layer AL1 and a low reflection layer AL2 may be additionally formed between the cathode Cathode and the encapsulation layer 400.

The capping layer AL1 may serve to improve the light emitting efficiency of a light emitting diode (LED) by a principle of constructive interference. The capping layer AL1 may include a material having a refractive index of about 1.6 or more for light having a wavelength of about 589 nm for example.

The capping layer AL1 may be an organic capping layer including organic materials, an inorganic capping layer including inorganic materials, or a composite capping layer including organic materials and inorganic materials. For example, the capping layer AL1 may include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compounds, heterocyclic compounds, and amine group-containing compounds may be optionally substituted with substituents including O, N, S, Se, Si, F, Cl, Br, I, or any combination thereof.

A low reflection layer AL2 may be disposed on the capping layer ALL The low reflection layer AL2 may overlap the entire surface of the substrate 110.

The low reflection layer AL2 may include an inorganic material having low reflectance, and in an embodiment, a metal or a metal oxide. In case that the low reflection layer AL2 includes a metal, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof may be included. In case that the low reflection layer AL2 includes the metal oxide, for example, $SiO_2$, $TiO_2$, $ZrO_2$, $Ta_2O_5$, $HfO_2$, $Al_2O_3$, $ZnO$, $Y_2O_3$, $BeO$, $MgO$, $PbO_2$, $WO_3$, $SiN_x$, $LiF$, $CaF_2$, $MgF_2$, $CdS$, or a combination thereof may be included.

In an embodiment, an absorption coefficient (k) of the inorganic material included in the low reflection layer AL2 may be 4.0 or less and 0.5 or more ($0.5 \leq k \leq 4.0$). The inorganic material included in the low reflection layer AL2 may have a refractive index (n) of 1 or more ($n \geq 1.0$).

The low reflection layer AL2 may induce destructive interference between the light incident into the display device and the light reflected from the metal disposed under the low reflection layer AL2, thereby reducing external light reflectivity. Accordingly, the display quality and visibility of the display device may be improved by reducing the reflectance of the external light of the display device through the low reflection layer AL2.

According to an embodiment, the capping layer AL1 may be omitted so that the low reflection layer AL2 may be in contact with the cathode Cathode.

An encapsulation layer 400 may be positioned on the low reflection layer AL2, and the other structures may be the same as those of FIG. 23, and a description thereof is omitted.

Multiple light-shielding linear patterns BL and the upper transparent inorganic layer TIL according to an embodiment of FIG. 23 and FIG. 24 have the structure corresponding to FIG. 19 (A), but it may have an embodiment as shown in FIG. 19 (B).

While this disclosure has been described in connection with what is considered to be practical embodiments, it is to be understood that the disclosure is not limited to the disclosed embodiments. On the contrary, this disclosure is intended to cover various modifications and equivalent arrangements included within the spirit and scope of the disclosure.

What is claimed is:

1. A light emitting display device comprising:
a light emitting diode (LED) positioned on a substrate and including an emission layer;
a pixel definition layer including an opening corresponding to the emission layer; and
a plurality of light-shielding linear patterns positioned on the pixel definition layer and the emission layer and extending in a first direction,
wherein the plurality of light-shielding linear patterns include a recess portion of a concave shape on a surface thereof that is farthest from the emission layer.

2. The light emitting display device of claim 1, wherein at least one of a plurality of light-shielding linear patterns crosses the emission layer and overlaps the emission layer.

3. The light emitting display device of claim 2, wherein a longest direction of extension of the recess portion extends in the first direction in the light-shielding linear pattern.

4. The light emitting display device of claim 2, wherein the plurality of light-shielding linear patterns include a viewing angle so that light emitted from the emission layer is not emitted at more than an angle with respect to a normal line, and
the viewing angle is about 30 degrees.

5. The light emitting display device of claim 2, wherein the plurality of light-shielding linear patterns includes a height of about 20 μm or more and about 50 μm or less, and a width is about 1 μm or more and about 3 μm or less.

6. The light emitting display device of claim 2, further comprising
an upper transparent organic layer positioned between adjacent ones of the plurality of light-shielding linear patterns,
the upper transparent organic layer includes a plurality of openings extending in the first direction, and
the plurality of light-shielding linear patterns are positioned in the plurality of openings.

7. The light emitting display device of claim 6, wherein the highest upper surface of at least one of the plurality of light-shielding linear patterns is positioned higher than the highest upper surface of the upper transparent organic layer.

8. The light emitting display device of claim 6, further comprising
an upper transparent inorganic layer positioned above the upper transparent organic layer and in a part that does not overlap the plurality of light-shielding linear patterns.

9. The light emitting display device of claim 8, wherein a width of the part where the upper transparent inorganic layer and the upper transparent organic layer contact each other is same, and
the plurality of light-shielding linear patterns are not positioned on the upper transparent organic layer.

10. The light emitting display device of claim 8, wherein the upper transparent inorganic layer includes a narrower width than the upper transparent organic layer, and
the plurality of light-shielding linear patterns are positioned on the upper transparent organic layer that is not covered by the upper transparent inorganic layer.

11. A manufacturing method of a light emitting display device, comprising:
coating a transparent organic material on a substrate on which a encapsulation layer is formed;
forming an upper transparent inorganic layer on the transparent organic material and a hard mask on the upper transparent inorganic layer;
etching the transparent organic material by using the hard mask as a mask to complete an upper transparent organic layer including an opening;
removing the hard mask;
coating a light-shielding organic material including a black color pigment on the upper transparent organic layer and the upper transparent inorganic layer; and
developing the light-shielding organic material to complete a light-shielding linear pattern.

12. The manufacturing method of claim 11, wherein
in the removing of the hard mask, a wet etching is performed using an etchant that removes the hard mask,
in the completing of the upper transparent organic layer, the hard mask is dry etched and a by-product is positioned within the opening of the upper transparent organic layer,
the etchant that removes the hard mask also removes the by-product together therewith,
the hard mask is formed of aluminum or an aluminum alloy, and
the by-product includes aluminum oxide.

13. The manufacturing method of claim 11, wherein
the forming of the upper transparent inorganic layer and the hard mask includes:
stacking and etching an inorganic insulating material or a transparent conductive oxide on the transparent organic material by using a first mask to complete the upper transparent inorganic layer; and
stacking a metal or an alloy on the upper transparent inorganic layer by using a second mask to complete the hard mask.

14. The manufacturing method of claim 13, wherein
the first mask and the second mask are a same mask,
the inorganic insulating material is a silicon oxide or a silicon nitride, and
the metal is aluminum or molybdenum.

15. The manufacturing method of claim 13, wherein
the first mask and the second mask are different masks, and
a width of the hard mask is larger than a width of the upper transparent inorganic layer.

16. The manufacturing method of claim 11, wherein
the upper transparent inorganic layer and the hard mask are formed by being dry-etched together by using one mask,
the upper transparent inorganic layer includes an inorganic insulating material or a transparent conductive oxide,
the inorganic insulating material is a silicon oxide or a silicon nitride,
the hard mask includes a metal or an alloy, and
the metal is aluminum or molybdenum.

17. The manufacturing method of claim 11, wherein the upper transparent inorganic layer and the hard mask are formed by being wet-etched together by using one mask, the upper transparent inorganic layer includes a transparent conductive oxide, the hard mask includes aluminum or an aluminum alloy, and a width of the hard mask is larger than a width of the upper transparent inorganic layer.

18. The manufacturing method of claim 11, wherein in the completing of the light-shielding linear pattern, a part adjacent to the upper transparent organic layer among the light-shielding organic material is maintained during the developing and a part far from the upper transparent organic layer is removed so that a recess portion is formed on the completed light-shielding linear pattern.

19. A vehicle including a first light emitting display device, wherein the first light emitting display device includes:

a light emitting diode (LED) positioned on a substrate and including an emission layer;

a pixel definition layer including an opening corresponding to the emission layer; and a plurality of first light-shielding linear patterns positioned on the pixel definition layer and the emission layer and extending in a first direction, wherein the plurality of first light-shielding linear patterns include a recess portion of a concave shape on a top surface thereof, the top surface being a surface farthest from the emission layer.

20. The vehicle including the first light emitting display device of claim 19, wherein the vehicle further includes a second light emitting display device, the second light emitting display device includes:

a light emitting diode (LED) positioned on a substrate and including an emission layer;

a pixel definition layer including an opening corresponding to the emission layer; and a plurality of second light-shielding linear patterns positioned on the pixel definition layer and the emission layer and extending in a second direction different from the first direction, and the plurality of second light-shielding linear patterns include a recess portion of a concave shape on a top surface thereof, the top surface being a surface farthest from the emission layer.

21. The vehicle including the first light emitting display device of claim 19, further comprising an upper transparent organic layer positioned between a plurality of adjacent first light-shielding linear patterns, and the upper transparent organic layer includes a plurality of openings extending in the first direction and the plurality of first light-shielding linear patterns are respectively positioned in the plurality of openings.

22. The vehicle of claim 21, wherein the highest upper surface of at least one of the first light-shielding linear patterns is positioned higher than the highest upper surface of the upper transparent organic layer.

23. The vehicle of claim 21, further comprising an upper transparent inorganic layer positioned at a portion on the upper transparent organic layer and does not overlap the plurality of first light-shielding linear patterns.

* * * * *